United States Patent [19]
Robey et al.

[11] Patent Number: 5,307,019
[45] Date of Patent: Apr. 26, 1994

[54] METHOD AND APPARATUS FOR DETERMINING THE WELD AND COIL RESISTANCES OF A MOTOR WINDING

[75] Inventors: Frank C. Robey, Acton, Mass.; Richard M. Chrisco, Ardmore, Okla.

[73] Assignee: Slaughter Company, Division of R. E. Phelon Company, Inc., Ardmore, Okla.

[21] Appl. No.: 948,111

[22] Filed: Sep. 21, 1992

[51] Int. Cl.$^5$ .................. G01R 27/14; G01R 31/06
[52] U.S. Cl. .................. 324/713; 324/704; 324/546
[58] Field of Search .......... 324/704, 713, 545, 546, 324/158 MG, 134

[56] References Cited
U.S. PATENT DOCUMENTS

| | | | |
|---|---|---|---|
| 2,890,407 | 6/1959 | Huehn et al. | 324/545 |
| 3,270,277 | 8/1966 | Ward | 324/545 |
| 3,896,376 | 7/1975 | Sinniger | 324/158 MG |
| 4,053,830 | 10/1977 | Porter | 324/545 |
| 4,651,086 | 3/1987 | Domenichini et al. | 324/64 |
| 4,766,387 | 8/1988 | Browne et al. | 324/545 |
| 4,864,242 | 9/1989 | Hurley | 324/545 X |
| 5,140,276 | 10/1992 | Fisher | 324/713 |
| 5,256,977 | 10/1993 | Domenichini et al. | 324/546 |

*Primary Examiner*—Kenneth A. Wieder
*Assistant Examiner*—Glenn W. Brown
*Attorney, Agent, or Firm*—Chapin, Neal & Dempsey

[57] ABSTRACT

Disclosed is a method and apparatus for determining weld and coil resistances of a commutator type electric motor armature. The method comprises the steps of determining a resistance ratio for a pair of coils and then determining the weld resistance across a commutator bar and coil connection based upon the resistance ratio.

5 Claims, 8 Drawing Sheets

METHOD AND APPARATUS FOR DETERMINING THE WELD AND COIL RESISTANCES OF A MOTOR WINDING

FIELD OF THE INVENTION

The present invention generally relates to test equipment for magnetomotive devices such as electric motors and more particularly, to electrical test equipment for determining resistances of the electrical components of such motors.

BACKGROUND OF THE INVENTION

In order to ensure compliance with customer specifications and government regulations, most electrical devices undergo a series of tests to ensure that they are operating within established limits. One class of electrical devices is that of commutator type electrical motors or generators. Motors or generators of this type generally employ a plurality of armature coils or windings which are connected in series. The ends of the coils re each connected to a commutator bar, which in turn, are brought in and out of contact with brush type contacts to thereby intermittently connect the coils to an electric power source for a motor or the electrical load for a generator.

The connections between each of the commutator bars and its associated coil is typically in the form of a weld or a solder joint and when testing the armature for winding anomalies and/or a defective weld connection, there can be significant testing problems. One of the inherent difficulties encountered during such testing is the large difference in values between the coil resistance itself and the resistance of the weld connection. For example, the resistance of a typical armature coil may be 0.5 ohms while the resistance of a weld may range from 40 micro ohms (for a ideal connection) to 500 micro ohms (for a non-open but unreliable weld). As a result of such great differences in resistance, the direct measurement of the resistance between two commutator bars cannot be relied upon to detect a defective connection between the coil and the commutator bar. For example, during manufacture the weld may be formed with a small discontinuity or void which, although not severe enough to cause an open circuit (large resistance) and thus be readily detectable, will be likely nonetheless to shorten the operating life of the motor. However, if each of the weld resistances can be accurately determined, then each such resistance can be compared with standard values to determine whether the weld is acceptable or must be rejected.

U.S. Pat. No. 4,651,086 to Axis S.p.A. discloses a method and apparatus for determining electrical resistance between the coils and commutator bars as well as the coil resistances themselves. As shown in FIG. 1 of this patent, a first d.c. current, $I_1$, is passed through a first set of commutator bars 1 and 2, and a second current source, $I_2$, is passed through a second set of commutator bars 3 and 2. Current $I_2$ is a dependent current source which is controlled by a feedback loop so as to null or completely cancel the currents flowing through the other armature coils ($R_{B6}$, $R_{B5}$, $R_{B4}$, and $R_{B3}$). As a result of no current flow through $R_{B6}$, a voltmeter can measure the voltage drop between commutator bars 1 and 6 which is really the voltage drop across $R_{S1}$. As such, the resistance of the weld, $R_{S1}$ can be calculated using the known value of $I_1$. As a practical matter, the method of the '096 patent attempts to completely eliminate the affect of the armature coil resistances so that direct measurements of the voltage drop across the welds, per se, can be obtained.

The method and apparatus of the '086 patent, however, have several disadvantages. In particular, the method requires the use of a cancelling current in the form of a dependent current, $I_2$, which may be difficult and expensive to control, especially in a production environment where noise is a significant problem. As a result, any current flow through $R_{B6}$ will affect the accuracy of the measured weld resistance $R_{S1}$. Further, the use of an additional current source can add noise which can induce errors into the measurement of the weld resistances.

SUMMARY OF THE INVENTION

The present invention relates to a method and apparatus for determining the weld and coil resistances of a commutator type magnetomotive device such as a motor or generator. One significant feature of the invention is that the weld resistance can be determined without the necessity of using a cancelling current as taught by the system of the [086 Patent while the results achieved are still independent of the individual coil resistances. Moreover, the present invention utilizes a simpler system architecture than conventional systems and/or methods.

The method of the present invention generally comprises the step of applying an electrical stimulus such as a d.c. current to pairs of commutator bars and measuring the voltage response between other sets of commutator bar pairs to obtain a set of armature coil resistance ratios which are indicative of the resistance across one armature coil with respect to the resistance across a second armature coil. The coil resistance ratios are then used to determine the weld resistances. Once the weld resistances are known, the individual coil resistances are then calculated by using the values of the weld resistances or by using the resistance ratios.

BRIEF DESCRIPTION OF THE DRAWINGS

The following detailed description of the invention will be better understood with reference to the accompanying drawings in which.

DETAILED DESCRIPTION OF THE PREFERRED EMBODIMENTS

Figure 1:
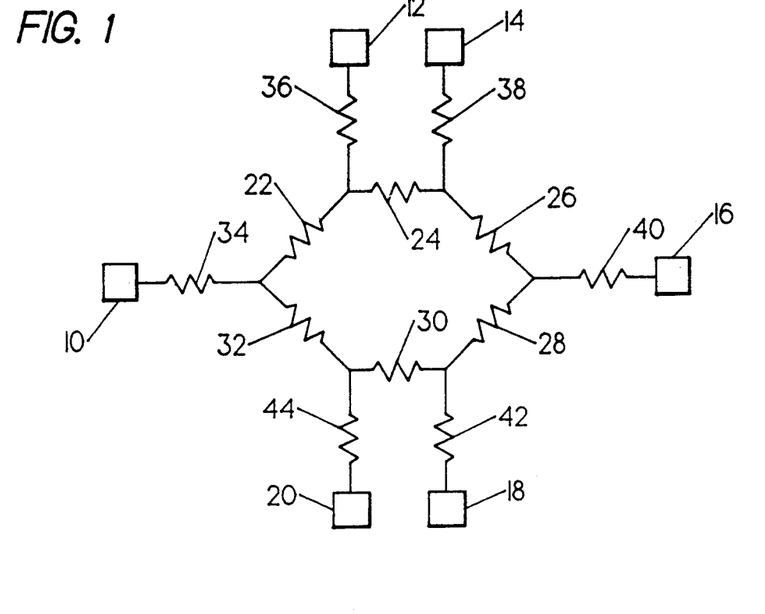
FIG. 1 is schematic diagram showing a six commutator bar armature.

Refer to FIG. 1 where a schematic diagram illustrates the circuit equivalence of a six commutator bar armature. As will become apparent to those skilled in the art, the method and testing apparatus of the present invention can be applied to any armature having at least five commutator bars. The armature consists of commutator bars 10, 12, 14, 16, 18 and 20 which are connected as shown to coils 22, 24, 26, 28, 30 and 32. The connections between the commutator bars 10, 12, 14, 16, 18, and 20 and their corresponding coils are represented by coil/commutator bar welds 34, 36, 38, 40, 42, and 44, respectively.

Figure 2:
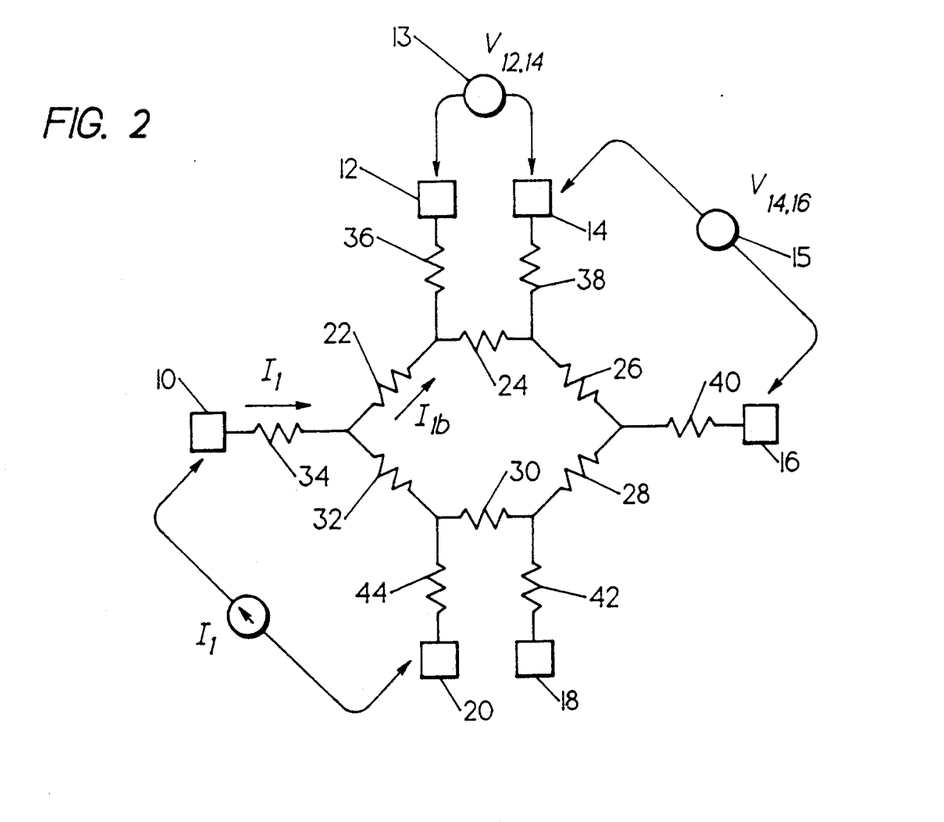
FIGS. 2 and 3 are schematic diagrams showing steps in the method embodying this invention.

As shown in FIG. 2, a d.c. current source $I_1$ is applied between adjacent commutator bars 10 and 20. One current path is from bar 10 through weld 34, coil 32 and weld 44 to bar 20. A second current path is illustrated by current path $I_{1b}$ from bar 10 through weld 34 and armature coils 22, 24, 26, 28, 30 and weld 44 to bar 20.

The voltage between bars 12 and 14, and bars 14 and 16 are then measured using high impedance volt meters 13 and 15 so that virtually no current flow occurs through commutator bar welds 36, 38, and 40. As a result, the ratio of the voltage measured between commutator bars 12 and 14 to the voltage measured between commutator bars 14 and 16 establishes the ratio of the resistance of armature coil 24 to the resistance of armature coil 26, $R_{c24}/R_{c26}$, where $R_{c24}$ is the resistance of armature coil 24 and $R_{c26}$ is resistance of armature coil 26.

Figure 3:
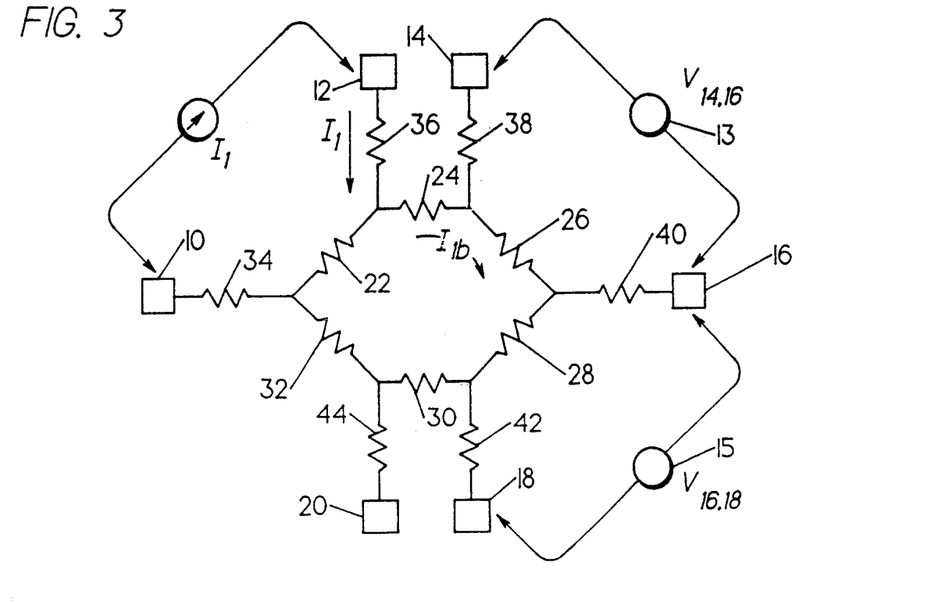

As shown in FIG. 3, the current source is now applied between bars 12 and 10 and the voltage drop across armature coils 26 and 28 are measured to yield the coil resistance ratio $R_{c26}/R_{c28}$. The above process can be continued around the commutator bars to obtain the remaining coil resistance ratios, namely $R_{c28}/R_{c30}$, $R_{c30}/R_{c32}$, $R_{c32}/R_{c22}$, and $R_{c22}/R_{c24}$.

Figure 4:
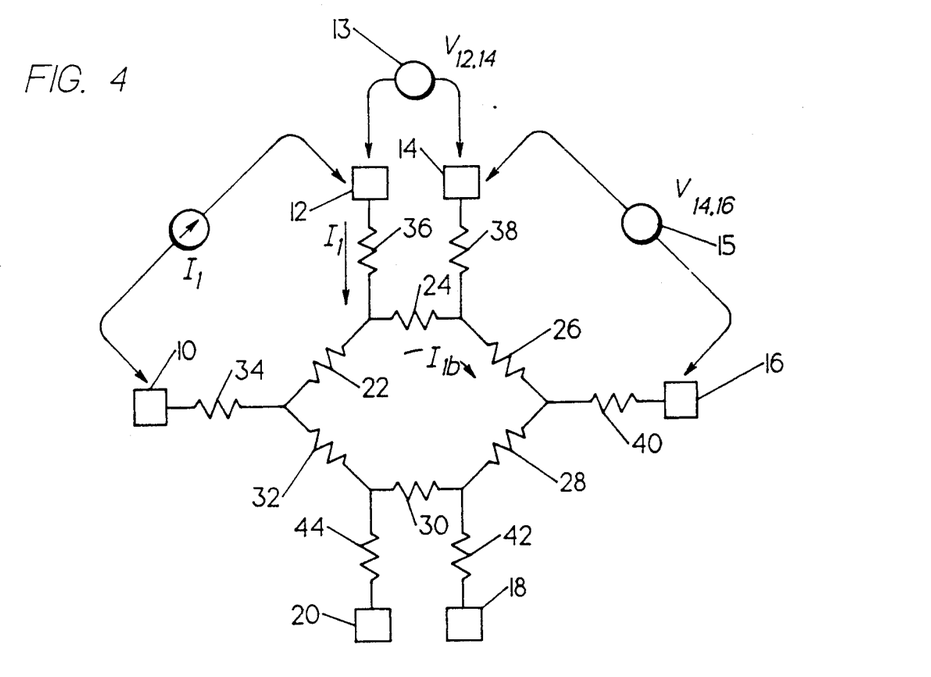
FIGS. 4 and 5 are schematic diagrams showing other steps in this method of the invention.

The coil resistance ratios may now be used to determine the weld resistance corresponding to each commutator bar denoted generally as $R_{wn}$. Referring to FIG. 4, if a current stimulus is applied at commutators bars 12 and 10, the voltages between commutator bars 12 and 14, and 14 and 16 can be measured by meters 13 and 15. Because meter 13 will measure the voltage drop across weld 36 in addition to the voltage drop across armature coil 24, these measured voltage along with the coil resistance ratio $R_{c24}/R_{26}$, can be used to determine the weld resistance associated with commutator bar 12, namely $R_{w36}$, by the equation:

$$R_{w36}=(V_{12,14})/I_1-(V_{14,16})I_1\ (R_{c24}/R_{c26}) \quad \text{Eq. 1}$$

Figures 5, 6:
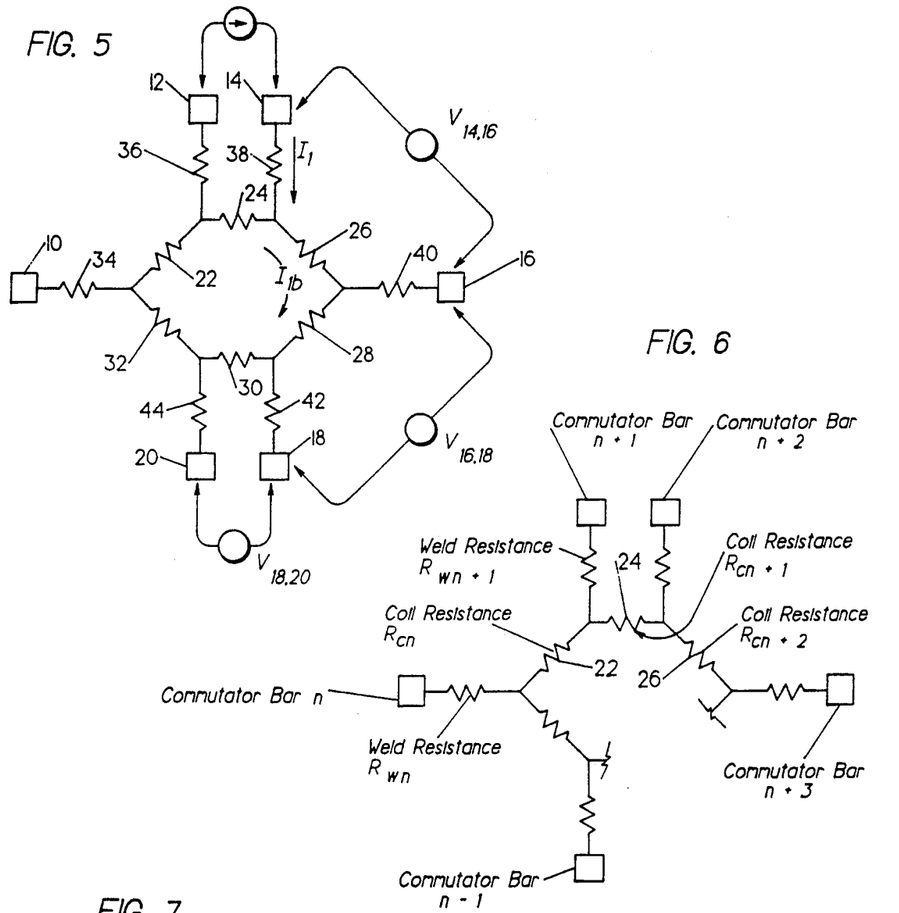
FIG. 6 is a schematic digram of a commutator bar armature having N bars, N weld resistances, and N coils.

As shown in FIG. 5, the current source is now applied between bars 14 and 12 and the voltage between bars 14 and 16, and bars 16 and 18 are measured. Similar to Eq. 1, the weld resistance corresponding to bar 14 can then be determined by the equation:

$$R_{w38}=(V_{14,16})/I_1-(V_{16,18})/I_1\ (R_{c26}/R_{c28}) \quad \text{Eq.}$$

The above steps can be continued around the armature yielding all of remaining weld resistances, namely $R_{w40}$, $R_{w42}$, $R_{w44}$, $R_{w34}$ by the equations:

$$R_{w40}=(V_{16,18})/I_1-(V_{18,20})/I_1\ (R_{c28}/R_{c30}) \quad \text{Eq. 3}$$

$$R_{w42}=(V_{18,20})/I_1-(V_{20,10})/I_1\ (R_{c30}/R_{c32}) \quad \text{Eq. 4}$$

$$R_{w44}=(V_{20,10})/I_1-(V_{10,12})/I_1\ (R_{c32}/R_{c22}) \quad \text{Eq. 5}$$

$$R_{w34}=(V_{10,12})/I_1-(V_{12,14})/I_1\ (R_{c22}/R_{c24}) \quad \text{Eq. 6}$$

The general equation for determining the weld resistance of any commutator bar upon application of a current $I_1$ across two adjacent commutator bars such as $n-1$ and $n$ can be written with reference to FIG. 6 which shows an armature having commutator bars $n-1$, $n$, $n+1$, $n+2$, etc., and weld resistances $R_{wn}$, $R_{wn+1}$, etc., and armature coil resistances $R_{cn}$, $R_{cn+1}$, $R_{cn+2}$, etc. The general equation for determining the weld resistance of any commutator bar weld, $R_{wn}$, can be written as:

$$R_{wn}=(V_{n,n+1})/I_1-(V_{n+1,n+2})/I_1\ (R_{cn}/R_{cn+1}) \quad \text{Eq. 7}$$

The derivation of Eq. 1 can be arrived at by noting that the ratio of the voltage measured between bars 12 and 14 to the applied current, $I_1$, of FIG. 4 follows the equation:

$$(V_{12,14})/I_1=(R_{c22}\times R_{c24})/\beta+R_{w36} \quad \text{Eq. 8}$$

where $\beta$ is defined as the sum of all the armature coil resistances.

$$\beta \equiv \text{sum of coil resistances} \quad \text{Eq. 9}$$

Further, the voltage measured between commutator bars 14 and 16 is given by the equation:

$$(V_{14,16})/I_1=(R_{c22}\times R_{c26})\beta \quad \text{Eq. 10}$$

Multiplying Eq. 10 by $R_{c24}/R_{c26}$ and subtracting the result from Eq. 8 yields Eq. 1.

Once the weld resistances for each of the commutator bars have been calculated, the resistances of each of the armature coils can then be determined by the equation:

$$R_{cn}=K_{cn}\ (\beta)^{\frac{1}{2}} \quad \text{Eq. 11}$$

Where $K_{cn}$ is a defined factor for each armature coil and with reference to FIG. 6, can be calculated generally according to the equation:

$$K_{cn}=((((V_{n+1,n+2})/I_1)-R_{wn+1})R_{cn}/R_{cn+1})^{\frac{1}{2}} \quad \text{Eq. 12}$$

when a current, I, has been applied between bars $n+1$, and $n$, and where $\beta$ can be determined by the equation:

$$\beta=(\Sigma K_{cn})^2 \quad \text{Eq. 13}$$

where $\Sigma K_{cn}$ is the sum over all armature coils.

Applying the above equations to the example described with reference to FIGS. 2–5 and the nomenclature of FIG. 6, $K_{cn}$ can be calculated as follows:

$$K_{c22}=((V_{12,14})/I_1-R_{w36})R_{c22}/R_{c24})^{\frac{1}{2}} \quad \text{Eq. 14}$$

$$K_{c24}=((V_{14,16})/I_1-R_{w38})R_{c24}/R_{c26})^{\frac{1}{2}} \quad \text{Eq. 15}$$

$$K_{c26}=((V_{16,18})/I_1-R_{w40})R_{c26}/R_{c28})^{\frac{1}{2}} \quad \text{Eq. 16}$$

$$K_{c28}=((V_{18,20})/I_1-R_{w42})R_{c28}/R_{c30})^{\frac{1}{2}} \quad \text{Eq. 17}$$

$$K_{c30}=((V_{20,10})/I_1-R_{w44})R_{c30}/R_{c32})^{\frac{1}{2}} \quad \text{Eq. 19}$$

$$K_{c32}=((V_{10,12})/I_1-R_{w34})R_{c32}/R_{c22})^{\frac{1}{2}} \qquad \text{Eq. 20}$$

Once $K_{c24}$, $K_{c26}$, $K_{c28}$, $K_{c30}$ and $K_{c32}$ are determined, then $\beta$ can be calculated in accordance with Equation 13. Thereafter, $\beta$ and the corresponding $K_{cn}$'s can be used to calculate the resistance of each armature coil, $R_{cn}$, according to Equation 11: $R_{cn}=K_{cn}(\beta)^{\frac{1}{2}}$.

As a matter of interest, Eqs. 11-13 can be derived by defining $K_{cn}^2$ as:

$$K_{cn}^2 = R_{cn}^2/\beta \qquad \text{Eq. 21}$$

Equation 21 can then be rewritten to solve for $R_{cn}$ to derive Equation 11: $R_{cn}=K_{cn}(\beta)^{\frac{1}{2}}$. Equation 21 can further be rewritten to solve for $K_{cn}$:

$$K_{cn} = R_{cn}/(\beta)^{\frac{1}{2}} \qquad \text{Eq. 22}$$

Taking the sum of both sides of Equation 22 over all n and solving for $\beta$ yields Eq. 13: $\beta=(\Sigma K_{cn})^2$, where $\Sigma K_{cn}$ represents the sum of all factors of K over all armature coils n.

The value of $R_{cn}^2/\beta$ in Eq. 21 can be derived by taking the product of several equations. For example, consider the value of $R_{cn}^2/\beta$ which corresponds to armature coil 22 and the following three equations:

$$(V_{14,16})/I_1 = \text{known value} \qquad \text{Eq. 23}$$

$$(R_{c24}/R_{c26}) = \text{known value} \qquad \text{Eq. 24}$$

$$(R_{c22}/R_{c24}) = \text{known value} \qquad \text{Eq. 25}$$

Taking the product of Equations 23-25 yields the equation:

$$K_{22}^2 = R_{c22}^2/\beta = (V_{14,16})/I_1 \times (R_{c24}/R_{c26}) \times (R_{c22}/R_{c24}) \qquad \text{Eq. 26}$$

Equation 26 can be used directly to solve for the K factor for each armature coil. Alternatively, the K factor can be written in terms of the weld resistance as follows. Solving for $R_{c24}/R_{c26}$ in Equation 1, yields the equation:

$$(R_{c24}/R_{c26})=(V_{12,14})/(V_{14,16})=R_{w36}I_1/(V_{14,16}) \qquad \text{Eq. 27}$$

Substituting Eq. 27 into Eq. 26 results in the following equation:

$$K_{22}^2 = R_{c22}^2/\beta = (V_{12,14}/I_1 \times R_{c22}/R_{c24}) - R_{w36}(R_{c22}/R_{c24}) \qquad \text{Eq. 28}$$

which can be rewritten to that of Eq. 14, namely, $K_{22}=((V_{12,14})/I - R_{w36})R_{c22}/R_{c24})^{\frac{1}{2}}$.

Figure 7:
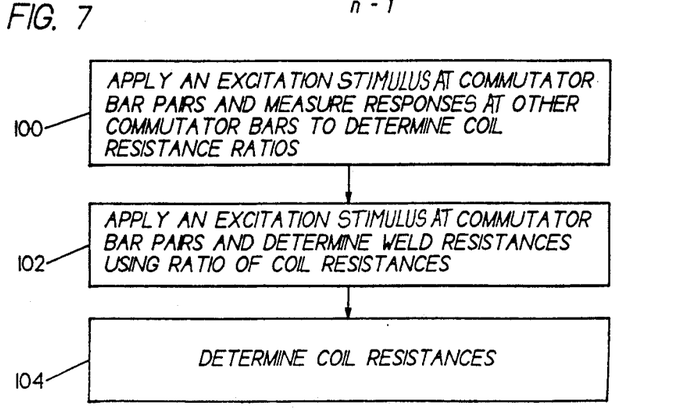
FIG. 7 is a high level flow chart illustrative of the method of the present invention.

The above described method can be generalized with reference to FIG. 7, where as shown by block 100, the first step of the method of this embodiment is generally to apply an electrical stimulus to pairs of commutator bars and to measure the response at some other pairs of commutator bars in order to determine "coil resistance ratios." The term "coil resistance ratio" is defined as the ratio of the resistance of one armature coil or the sum of adjacent armature coils, to the resistance of a second armature coil or the sum of adjacent armature coils, wherein such ratios may be for coils or sums of coils which are adjacent or non-adjacent.

As shown by block 102, the next step of this method is to apply a stimulus and measure response voltages between some other pairs of commutator bars in order to determine weld resistances based upon the previously determined coil resistance ratios. As shown by block 104, the next step is to calculate the individual coil resistances using the weld resistances.

Figure 8A:
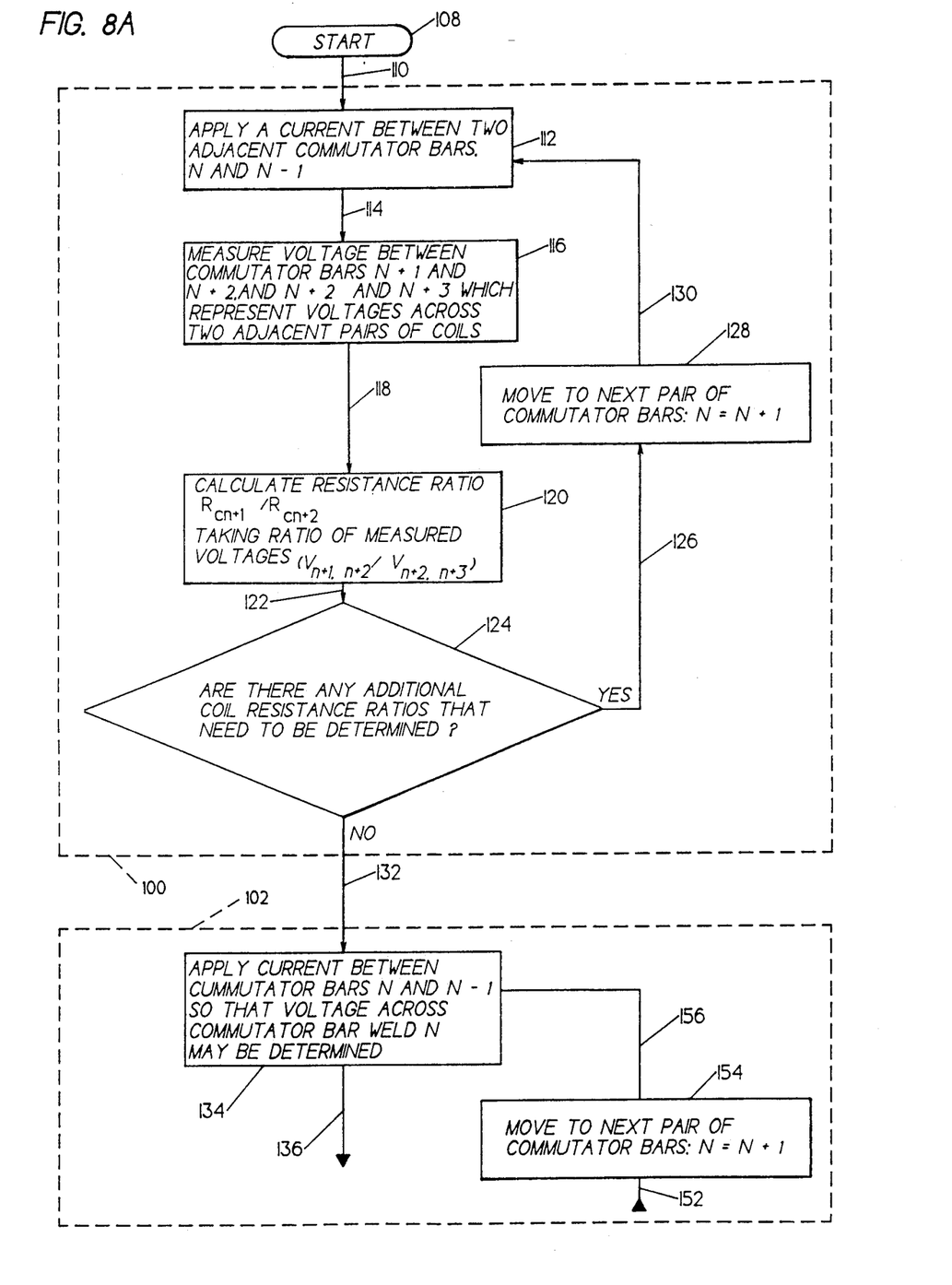
FIGS. 8A-8C are a flow chart further describing the method of FIG. 7.
Figure 8B:
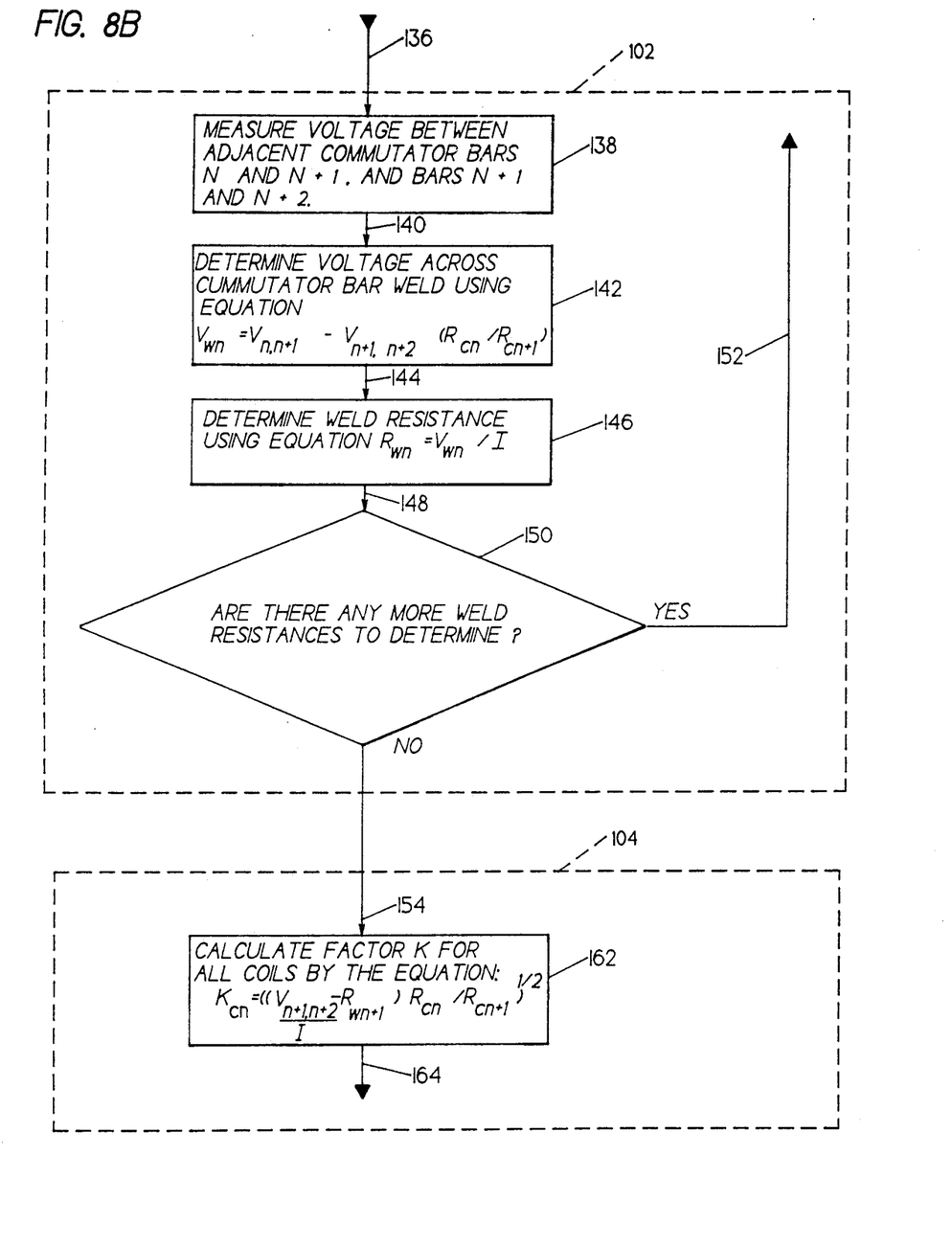
Figure 8C:
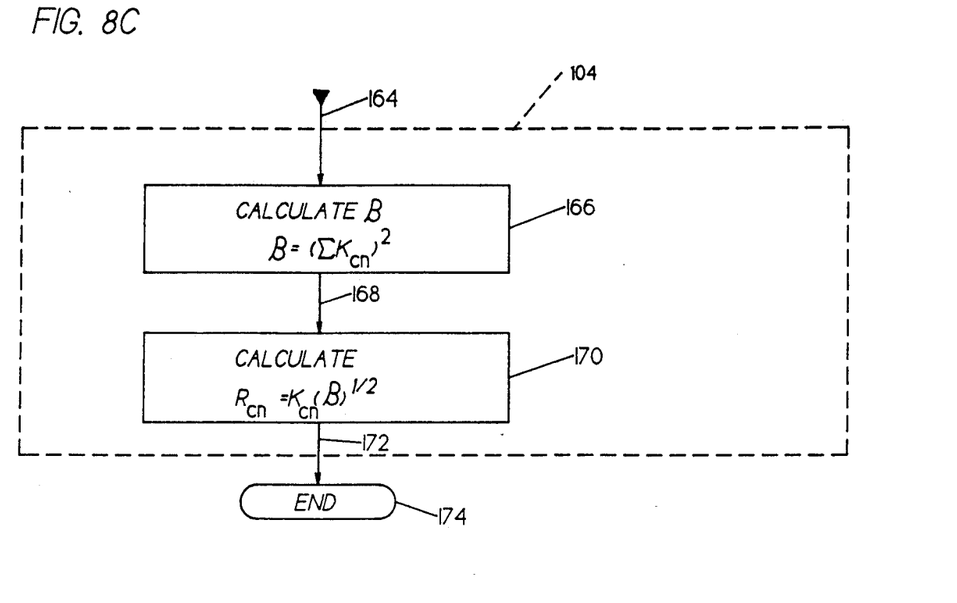

The flow chart of FIGS. 8A-8C illustrate a further description of FIG. 7 having phantom lines to delineate blocks 100, 102, and 104 of FIG. 6. A start block 108 initiates operation and control is then passed along a path 110 to an operational block 112.

As shown by block 112, the system is configured to apply a current between two adjacent commutator bars n and n−1. Control is then passed along a path 114 to an operational block 116.

As shown by operation block 116, the system is then configured to measure the voltage between bars n+1 and n+2, and bars n+2 and n+3 which correspond to measuring the voltage across two adjacent coils which are not part of the same circuit loop where the excitation stimulus is being applied. Control is then passed along a path 118 to an operation block 120.

As shown by operational block 120, the system is configured to calculate the coil resistance ratio ($R_{cn+1}/R_{cn+2}$) by taking the ratio of the voltages measured between commutator bars n+1 and n+2, and commutator bars n+2 and n+3. Control is then passed along a path 122 to a decisional block 124.

As shown by decisional block 124, the system then decides whether any additional coil resistance ratios need to be determined. If additional coil resistance ratios need to be determined, then control is passed along a path 126 to block 128 where a counter selects the next pair of commutator bars and then along a path 130 to block 116 where the above steps are repeated. If, however, no additional coil resistance ratios need to be determined, then control is passed along a path 132 to an operational block 134.

As shown by operational block 134, the system is then configured to apply a current stimulus between commutator bars n and n−1 so that the weld voltage corresponding to commutator bar n may be determined. Control is then passed along a path 136 to an operational block 138 in FIG. 8B.

As shown by operational block 138, the system is then configured to measure the voltage response between commutator bars n and n+1, and bars n+1 and n+2. Control is then passed along a logic path 140 to an operational block 142.

As shown by operational block 142, the system is then configured to determine the voltage across the commutator bar weld using the equation: $V_{wn}=V_{n,n+1}-V_{n+1,n+2}(R_n/R_{n+1})$. Control is then passed along a path 144 to an operational block 146. As shown by operational block 146, the system is configured to determine the weld resistance using the equation $R_{wn}=V_{wn}/I$. These two steps represent Eq. 7. Control is the passed along a path 148 to a decisional block 150.

As shown by decisional block 150, the system is then configured to device whether there are any more weld resistances to be determined. If there are additional weld resistances to be determined, then control is passed along a path 152 to an operational block 154 where the next pair of commutator bars are selected and control is then returned along a path 156 to operational block 134 where a stimulus current is applied to these commutator bars. If, however, all weld resistances have been determined, then control is passed along a path 154 to an operational block 162.

As shown by operational block 162, the factor $K_{cn}$ for each armature coil is then calculated using Equation 12: $K_{cn} = ((((V_{n+1,n+2})/I_1) - R_{wn+1})R_{cn}/R_{cn+1})^{\frac{1}{2}}$. Control is then passed along path 164 to an operational block 166.

As shown by operational block 166, the factor $\beta$ is calculated according to Equation 13: $\beta = (\Sigma K_{cn})^2$. Control is then passed along a path 168 to an operational block 170 where each of the coil resistances is calculated according to Equation 11: $R_{cn} = K_{cn}(\beta)^{\frac{1}{2}}$. Control is then passed along a path 172 to an end block 174 where the testing operations are concluded.

The operations described with reference to FIGS. 8A-8C may be combined to increase the speed of the testing process. In particular, steps 100 and 102 can be combined so that weld resistances are determined as soon as the appropriate coil resistance ratio has been determined. The pseudo-code for an N-bar commutator for implementation of this process is shown in Table 1 below:

TABLE 1

For n = 1 to N,
Apply current source, I, between bar n and n−1
Measure voltage, between bar n and n+1
  Calculate ratio $a_n = V_{n,n+1}/I_1$
Measure voltage between bar n+1, and n+2
Measure voltage between bar n+2, and n+3
  Calculate $R_{cn+1}/R_{cn+2} = V_{n+1,n+2}/V_{n+2,n+3}$
If n > 1, calculate $R_{wn} = a_n - (V_{n+1,n+2})/I_1(R_{cn}/R_{cn+2})$
  Calculate $R_{wn}$ for n = 1
For n = 1 to N
Calculate $K_{cn} = (((a_nI_1) - R_{wn+1})R_{cn}/R_{cn+1})^{\frac{1}{2}}$
Calculate $\beta$ $\beta = (\Sigma K_{cn})^2$ For n = 1 to N
Calculate $R_{cn} = K_{cn}(\beta)^{\frac{1}{2}}$ Alternative Implementation The above method involves measuring response voltages at the commutator bars and the processing of such values to determine the weld and coil resistances. In this regard, when the ratio of the coil to weld resistances are on the order of 1,000 to 10,000, the test system components must have relatively high resolution capability in order to obtain accurate weld resistances. This level of accuracy is especially difficult and expensive to accomplish in a production environment due to electromagnetic interference and other noise sources and the speed with which the measurements must be made. Coil resistances are typically within 1% of each other for small motors and 2% for large horsepower motors. This matching can be utilized to lower the test system resolution requirements needed to measure weld resistances to a specified accuracy.

Figure 9:
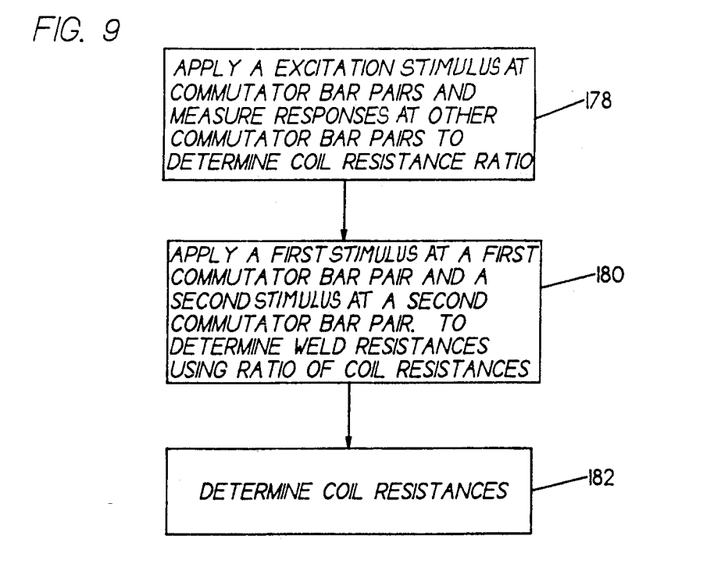
FIG. 9 is a high level block diagram showing a second method of the present invention.

FIG. 9 shows a high level block diagram of a second method of the present invention which is suitable for use when the maximum limit of the coil to weld resistance ratios are greater than 100. Generally and as shown by block 178, a stimulus is applied and the coil resistance ratios are determined similarly as described with reference to block 100 of FIGS. 6 and 7. Thereafter, and unlike the first method, two stimuli and applied when determining the weld resistances. Thereafter and as shown by block 182, the coil resistances are calculated using the weld resistances.

Figure 10:
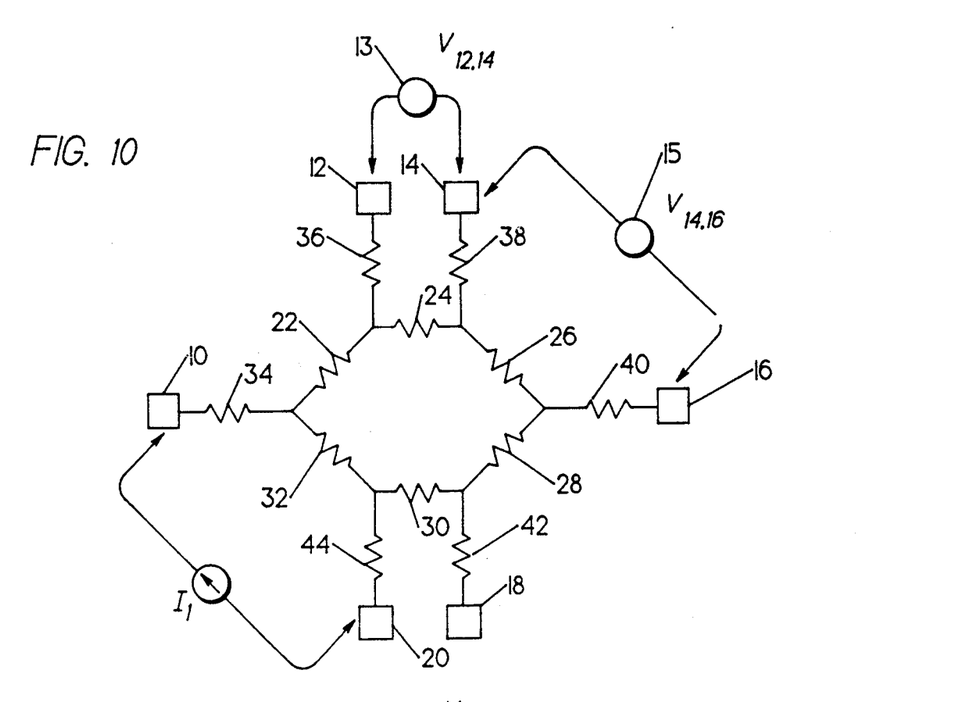
FIGS. 10 and 11 are schematic diagrams showing steps of another embodiment of the present invention.

An example of the above method is shown and described with reference to FIG. 10 where a first current source, $I_1$, may be applied between bars 10 and 20, and for example, the voltage between bars 12 and 14, and 14 and 16 can be measured by meters 13 and 15, respectively, to thereby obtain the resistance ratio, $R_{c24}/R_{c26}$. This process as heretofore described may be continued around the commutator bars to yield all of the other armature coil resistance ratios, namely $R_{c26}/R_{c28}$, $R_{c28}/R_{c30}$, $R_{c30}/R_{c32}$, $R_{c32}/R_{c22}$, and $R_{c22}/R_{c24}$.

Figure 11:
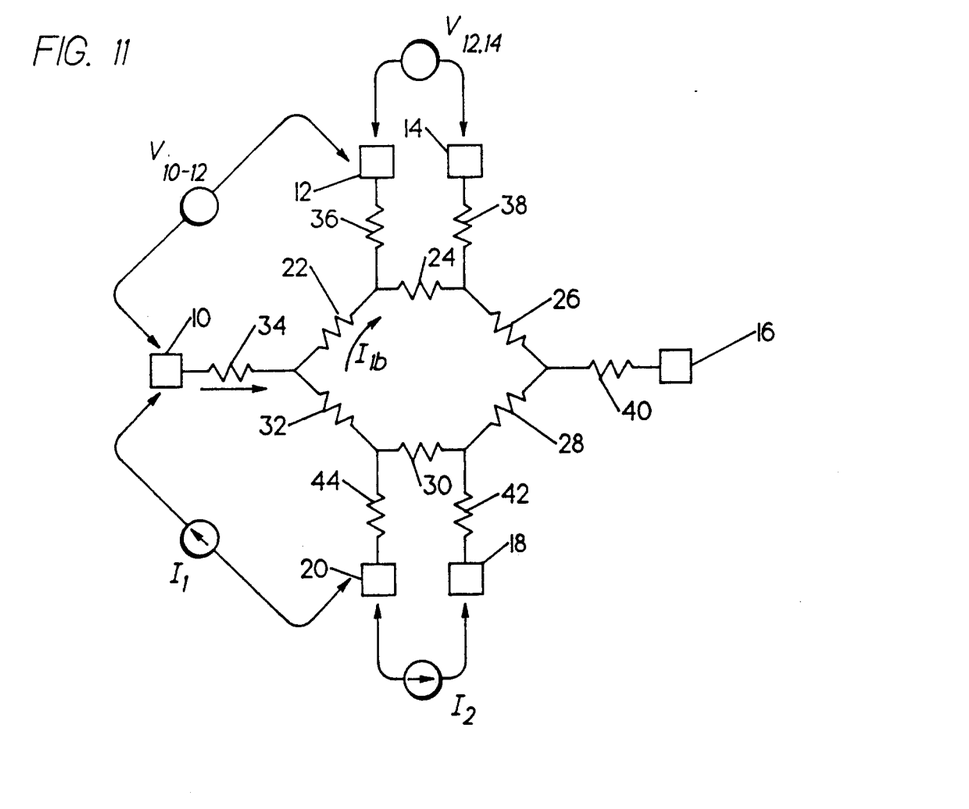

Thereafter, two independent d.c. current sources, $I_1$ and $I_2$, are concurrently applied as shown in FIG. 11 between bars 10 and 20, bars 18 and 20. In one embodiment, current sources $I_1$ and $I_2$ are independent current sources which are equal to each other. The weld resistance corresponding to commutator bar 10 ($R_{w34}$) can be determined using Eq. 6: $R_{w34} = (V_{10,12})I_1 - (V_{12,14})/I_1 (R_{c22}/R_{c24})$. Note that this equation is also equivalent to the following equation:

$$R_{234} = (V_{10,12})/I_1 - (R_{c32} - R_{c30})R_{c24}/\beta \times (R_{c22}/R_{c24}) \qquad \text{Eq. 29}$$

Depending upon the match between the coil resistances, $R_{c32}$ and $R_{c30}$, Equation 29 can completely decouple into a simple solution for $R_{w34}$. For example, if $R_{c32} = R_{c30}$, then Equation 29 decouples into the following simple equation:

$$R_{w34} = (V_{10,12})/I_1 \qquad \text{Eq. 30}$$

As a practical matter, the coil resistances $R_{c32}$ and $R_{30}$ will never be exactly the same and as such, the value of $(V_{12,14})/I_1$ of Eq. 6 (or equivalently, $(R_{c32} - R_{c30})R_{c24}/\beta$ of Eq. 29) will be a finite, but smaller number. The advantage of this step, however, is that a smaller magnitude for $(V_{12,14})$ implies that the $(V_{10,12})$ will be dominated more by the voltage across the weld resistance rather than by the voltage across the armature coil. In that coil resistances are typically within 1% of each other for small motors and 2% for large horsepower motors, the maximum coil resistance ratios can be determined prior to testing. If the voltage balancing step is not performed when coil resistance to weld resistance ratios are greater than 100, the error associated with measuring $(V_{12,14})$ may result in an overall error for the calculation of $R_{w34}$ which is greater than the actual, although unknown, value of the weld resistance.

The pseudo-code for an N-bar commutator which comprises the above-described alternative method is shown in Table 2 below:

TABLE 2

For n = 1 to N,
Apply current source, $I_1$, between bar n and n−1
Measure voltage, between bar n and n+1
  Calculate ratio $a_n = V_{n,n+1}/I_1$
Measure voltage between bar n+1, and n+2
Measure voltage between bar n+2, and n+3
  Calculate $R_{cn+1}/R_{cn+2} = V_{n+1,n+2}/V_{n+2,n+3}$
Apply a second current source, $I_2$ equal to $I_1$, between bars n−2 and n−1
Measure the voltage between bars n and n+1
  Calculate ratio $b_n = (V_{n,n+1})/I_1$
Measure the voltage between bars n+1 and n+2
  If n > 1, calculate
    $R_{wn} = b_n - (V_{n+1,n+2})/I_1(R_{cn}/R_{cn+1})$ Calculate $R_{wn}$ for n=1
For n=1 to N
Calculate $K_{cn}=((((V_{n+1,n+2})/I1)-R_{wn+1})R_{cn}/R_{cn+1})^{\frac{1}{2}}$
Calculate $\beta$ $$\beta=(\Sigma K_{cn})^2$$

For n=1 to N
Calculate $R_{cn}=K_{cn}(\beta)^{\frac{1}{2}}$

Figure 12:
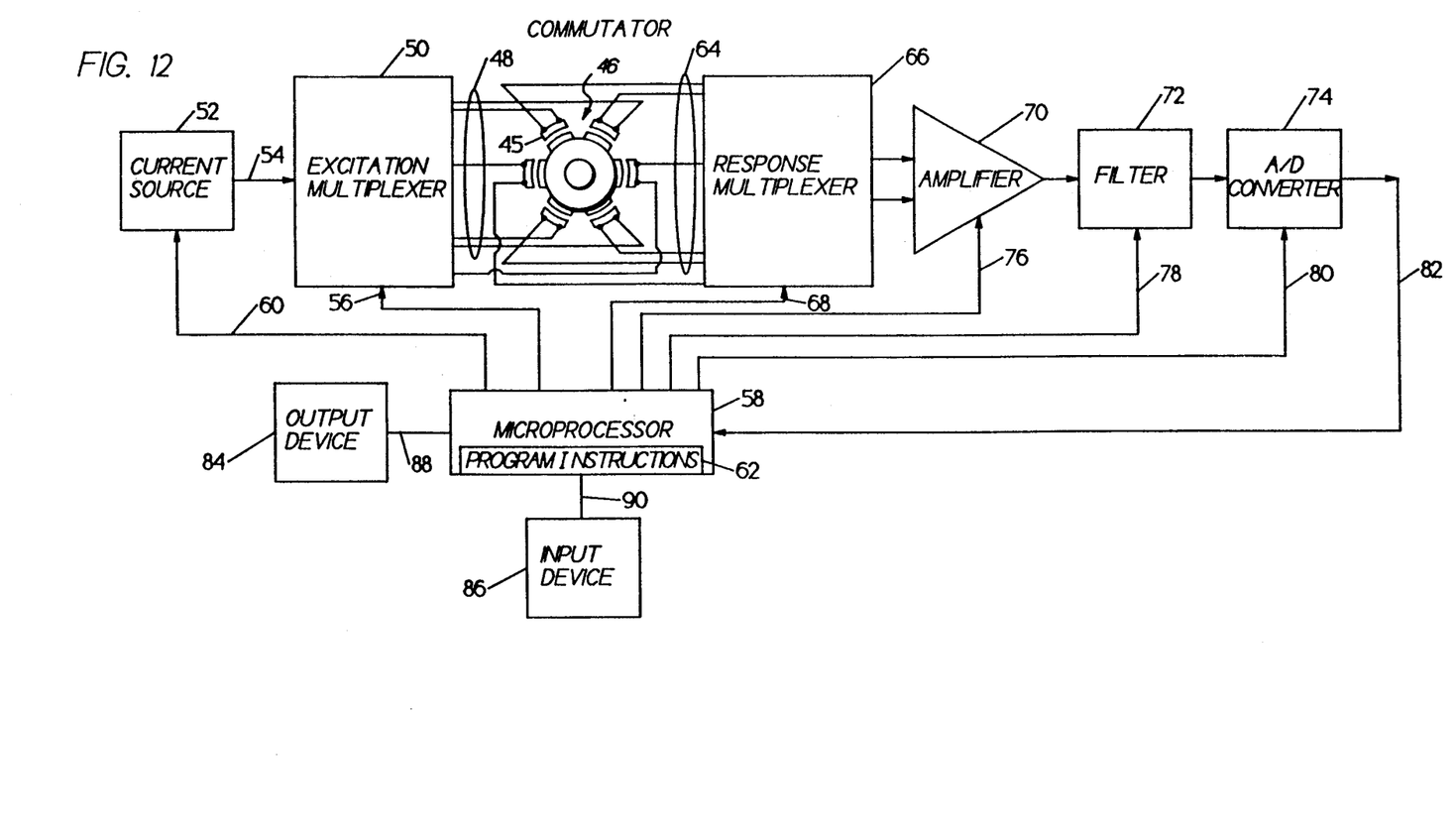
FIG. 12 is a high level block diagram illustrating a system or apparatus of the type embodying the present invention.

FIG. 12 shows a block diagram depicting the test system of the present invention which includes an armature test fixture 46 adapted to hold, for example, a six bar commutator. Each commutator bar is electrically connected to an excitation multiplexer 50 by a path 48. The multiplexer 50 is connected via a path 54 to a current source 52 which is adapted to supply a current stimulus. Alternatively, if the embodiment of FIGS. 10 and 11 are employed, a second independent current source will be provided. The multiplexer 50 and current source 52 are connected by paths 56 and 60, to a microprocessor 58 having a program instruction module 62 which, among other things, is adapted to control the current source 52 and the multiplexer 50 so that a current stimulus can be selectively applied to any given pair of commutator bars. For example, program instruction module 62 may be similar to the operations of the flow chart of FIGS. 8A–8C or the Pseudo-code of Table 1.

Each commutator bar is also connected to a response multiplexer 66 by a path 64. The multiplexer 66 is connected along a path 68 to microprocessor 58 to thereby receive channel select signals from the microprocessor and to output voltages measured at any selected pair of commutator bars to an amplifier 70. The amplifier 70 measures the voltage response and provides an amplified signal to a filter 72 which in turn sends the signal to an analog-to-digital (A/D) converter where the analog signal is converted to a digital signal. The resultant digital signal is outputted along a path 82 to the microprocessor which stores and processed the information as heretofore described. Also shown is an output device 84 and an input device 86 connected along paths 88 and 90, respectively, to microprocessor 58. The input device 86 is provided so that the user may, for example, select a particular set of test conditions. The output device 84 is provided so that the user may, for example, display or print-out the results of the testing process.

ALTERNATIVE EMBODIMENTS

One significant feature of the present invention heretofore described has been the determination of coil resistance ratios and the use of the same to determine the weld resistances. In particular, the invention has been described with reference to coil resistance ratios of adjacent coils. However, it will be recognized that the method and apparatus of the present invention can readily be practiced, for example, with resistance ratios having non-adjacent coils or ratios of sums of adjacent coil resistances.

It should be understood that the foregoing description is intended primarily for purposes of illustration. This invention may be embodied in other forms or carried out in other ways without departing from the spirit or scope of the invention.

What is claimed:

1. Method of determining the resistance of welds used to join the coils of the armature of a magnetomotive device and commutator bars, the device having a plurality of armature coils connected together in a closed loop, each of said coils having terminal ends welded to said commutator bars, said method comprising the steps of:
    (a) imposing a d.c. current across a first pair of adjacent commutator bars so that a portion of said current flows along a first path from one bar of said first pair of bars to the other bar of said first pair of bars through one of said armature coils the terminals of which are connected to said first pair of bars and another portion of said current flows along a second path from one of said first pair of bars, through others of said armature coils and to said other bar of said first pair of bars to provide a voltage drop across each of the other armature coils;
    (b) disposing high impedance voltage measuring means across a second pair of adjacent commutator bars and across a third pair of adjacent commutator bars, said second pair and third pair of bars being selected to include one bar that is common to said second pair and third pair of bars, said first pair of bars being separate from said second and third pair of bars, so that the voltage drops measured by said voltage measuring means disposed across said second pair and third pair of bars are essentially proportional to the respective resistance across each of two armature coils connected to the commutator bars of said second pair and third pair of bars;
    (c) determining the ratio of the resistances of said two armature coils;
    (d) thereafter, imposing a d.c. current across a fourth pair of adjacent commutator bars so that the thereafter imposed current has a circuit path which includes a weld common to said fourth pair of bars and to one of said second pair and third pair of bars; and
    (e) using the resistance ratio of the two armature coils to determine the resistance of said weld common to said fourth pair of bars and to one of said second pair and third pair of bars.

2. Method of claim 1, wherein upon the determination of armature coil resistance ratio the resistance of each weld to each commutator bar is determined.

3. Method of claim 2, wherein the resistance of each armature coil is determined.

4. Method of claim 1, wherein the step of imposing the d.c. current across the fourth pair of said adjacent commutator bars, the fourth pair of said adjacent commutator bars is selected so that said thereafter imposed current flows through the weld common to said fourth pair and said second pair of adjacent commutator bars.

5. Method of claim 1, wherein said high impedance voltage measuring means comprises a voltage meter disposed across said second pair of bars and a voltage meter disposed across said third pair of bars.

* * * * *